United States Patent
Park et al.

(10) Patent No.: US 12,037,528 B2
(45) Date of Patent: Jul. 16, 2024

(54) METHOD OF SYNTHESIZING SYNCHRONIZED PIEZOELECTRIC AND LUMINESCENT MATERIAL WITH PIEZOELECTRIC LIGANDS AND LIGHT-EMITTING PARTICLES

(71) Applicant: UIF (University Industry Foundation), Yonsei University, Seoul (KR)

(72) Inventors: Cheolmin Park, Seoul (KR); Seokyeong Lee, Seoul (KR); Joona Bang, Seoul (KR); Jaewan Ko, Seoul (KR); Taewoo Lee, Seoul (KR); Sungjin Kim, Seoul (KR)

(73) Assignee: UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 0 days.

(21) Appl. No.: 18/198,110

(22) Filed: May 16, 2023

(65) Prior Publication Data
US 2023/0287260 A1    Sep. 14, 2023

Related U.S. Application Data

(62) Division of application No. 17/106,581, filed on Nov. 30, 2020, now Pat. No. 11,692,130.

(30) Foreign Application Priority Data

Aug. 11, 2020  (KR) .................. 10-2020-0100268

(51) Int. Cl.
*C09K 11/02* (2006.01)
*B82Y 15/00* (2011.01)
(Continued)

(52) U.S. Cl.
CPC .............. *C09K 11/025* (2013.01); *C07F 7/24* (2013.01); *C09K 11/06* (2013.01); *H10K 50/115* (2023.02);
(Continued)

(58) Field of Classification Search
CPC ... C09K 11/025; C09K 11/06; C09K 2211/10; C09K 11/02; C09K 11/664; C09K 11/08;
(Continued)

(56) References Cited

U.S. PATENT DOCUMENTS 7,378,151 B2 * 5/2008 Sato ................ C09K 11/68
977/773
7,919,012 B2 * 4/2011 Peng ................ H01S 5/30
252/301.4 R
(Continued)

FOREIGN PATENT DOCUMENTS

KR    10-2017-0025335 A    3/2017

OTHER PUBLICATIONS

Qingchao Zhou et al., "In Situ Fabrication of Halide Perovskite Nanocrystal-Embedded Polymer Composite Films with Enhanced Photoluminescence for Display Backlights", Advanced Materials, 2016, pp. 9163-9168, vol. 28.
(Continued)

*Primary Examiner* — Caleb E Henry
(74) *Attorney, Agent, or Firm* — Paratus Law Group, PLLC

(57) ABSTRACT

There is provided a method of preparing a synchronized piezoelectric and luminescence material. The method includes mixing a solution (a) including light-emitting particles or precursors thereof and a solution (b) including ligands having a piezoelectric property in a polar solvent; and optionally, mixing a solution (c) including ligands
(Continued)

having a piezoelectric property in an antisolvent together with the solution (a) and the solution (b), if necessary.

4 Claims, 3 Drawing Sheets

(51) Int. Cl.
| | |
|---|---|
| *B82Y 20/00* | (2011.01) |
| *B82Y 40/00* | (2011.01) |
| *C07F 7/24* | (2006.01) |
| *C09K 11/06* | (2006.01) |
| *H10K 50/115* | (2023.01) |
| *H10K 71/00* | (2023.01) |
| *H10K 71/12* | (2023.01) |
| *H10K 77/10* | (2023.01) |
| *H10K 85/10* | (2023.01) |
| *H10K 85/30* | (2023.01) |
| *H10K 85/60* | (2023.01) |
| *H10K 102/00* | (2023.01) |
| *H10N 30/092* | (2023.01) |
| *H10N 30/85* | (2023.01) |

(52) U.S. Cl.
CPC ............ *H10K 71/00* (2023.02); *H10K 71/12* (2023.02); *H10K 77/111* (2023.02); *H10K 85/30* (2023.02); *H10N 30/092* (2023.02); *H10N 30/852* (2023.02); *B82Y 15/00* (2013.01); *B82Y 20/00* (2013.01); *B82Y 40/00* (2013.01); *C09K 2211/10* (2013.01); *H10K 85/111* (2023.02); *H10K 85/113* (2023.02); *H10K 85/636* (2023.02); *H10K 85/6572* (2023.02); *H10K 2102/311* (2023.02)

(58) Field of Classification Search
CPC ......... C07F 7/24; H10K 50/115; H10K 71/00; H10K 71/12; H10K 77/111; H10K 85/30; H10K 85/111; H10K 85/113; H10K 85/636; H10K 85/6572; H10K 2102/311; H10N 30/092; H10N 30/852; H10N 30/857; B82Y 15/00; B82Y 20/00; B82Y 40/00; B82Y 30/00; Y02E 10/549; C08J 5/18; C08J 2327/22; H01L 33/343; Y10S 977/774
See application file for complete search history.

(56) References Cited

U.S. PATENT DOCUMENTS

| | | | | |
|---|---|---|---|---|
| 8,221,651 B2* | 7/2012 | Murase | ................ | C09K 11/02 |
| | | | | 977/819 |
| 8,664,637 B2* | 3/2014 | Jang | ................ | H01L 33/06 |
| | | | | 257/99 |
| 9,334,440 B2* | 5/2016 | Jang | ................ | C09K 11/883 |
| 9,957,442 B2* | 5/2018 | Banin | ................ | C09K 11/883 |
| 10,975,299 B2* | 4/2021 | Kim | ................ | H10K 50/16 |
| 2009/0049890 A1* | 2/2009 | Zhong | ................ | G01N 33/497 |
| | | | | 73/23.3 |
| 2010/0027192 A1* | 2/2010 | Perry | ................ | C01G 1/02 |
| | | | | 977/773 |
| 2010/0051917 A1* | 3/2010 | Kippelen | ................ | H10K 10/478 |
| | | | | 257/E51.027 |
| 2014/0091278 A1* | 4/2014 | Sykora | ................ | H10K 30/151 |
| | | | | 257/14 |
| 2015/0083969 A1* | 3/2015 | Kim | ................ | C09K 11/705 |
| | | | | 977/774 |
| 2015/0129838 A1* | 5/2015 | Lewis | ................ | H01L 31/035236 |
| | | | | 438/94 |
| 2015/0295194 A1* | 10/2015 | Kanatzidis | ................ | H10K 85/00 |
| | | | | 136/263 |
| 2016/0380136 A1* | 12/2016 | Ning | ................ | C09K 11/02 |
| | | | | 252/519.4 |
| 2017/0125747 A1* | 5/2017 | Lee | ................ | H10K 50/16 |
| 2017/0179338 A1* | 6/2017 | Park | ................ | H01L 33/04 |
| 2017/0222162 A1* | 8/2017 | Lee | ................ | H10K 85/10 |
| 2017/0306227 A1* | 10/2017 | Ippen | ................ | C09K 11/70 |
| 2017/0324057 A1* | 11/2017 | Friend | ................ | H10K 85/30 |
| 2017/0342317 A1* | 11/2017 | Lee | ................ | C09K 11/06 |
| 2017/0346024 A1* | 11/2017 | Lee | ................ | H10K 30/35 |
| 2017/0358757 A1* | 12/2017 | Lee | ................ | C01G 21/006 |
| 2017/0358759 A1* | 12/2017 | Lee | ................ | C01G 21/16 |
| 2018/0090312 A1* | 3/2018 | Pickett | ................ | H10K 85/60 |
| 2019/0162798 A1* | 5/2019 | Butzloff | ................ | C01B 33/405 |
| 2020/0239769 A1* | 7/2020 | Jen-La Plante | ...... | C09K 11/025 |
| 2020/0299576 A1* | 9/2020 | Lim | ................ | C09K 11/892 |

OTHER PUBLICATIONS

Zunxian Yang et al., "Ultrastable Quantum Dot Composite Films under Severe Environments", ACS Applied Materials & Interfaces, 2018, pp. 15880-15887, vol. 10.
Japanese Office Action for related JP application No. 2020-199041 mailed Jan. 11, 2022 from Japanese Patent Office.

* cited by examiner

METHOD OF SYNTHESIZING SYNCHRONIZED PIEZOELECTRIC AND LUMINESCENT MATERIAL WITH PIEZOELECTRIC LIGANDS AND LIGHT-EMITTING PARTICLES

CROSS-REFERENCE TO RELATED APPLICATIONS

This application is a Divisional Application of U.S. patent application Ser. No. 17/106,581 (filed on Nov. 30, 2020), which claims priority under 35 U.S.C. § 119 to Korean Patent Application No. 10-2020-0100268 (filed on Aug. 11, 2020), which are all hereby incorporated by reference in their entirety.

BACKGROUND

The present invention relates to a synchronized piezoelectric and luminescence material and an element including the same, and more particularly, to a single synchronized piezoelectric and luminescence (SPL) material including light-emitting particles and ligands with a piezoelectric property to simultaneously have a piezoelectric property and a luminescent property, and an element using the same.

A hyper-connected society, in which future people, objects, and spaces are fused, requires electronics which may detect and display a variety of further types of massive human sensory information and may be automatically and constantly driven.

However, the current high integration electronic information (digital content) processing methods through scaling (scaling-down or miniaturization) will soon reach a technical limit and will be expected to be unable to meet processing demands for massive human information data in the future society. In addition, in the current high integration methods through miniaturization of elements that perform an independent function of detecting or displaying human sensory information, due to the limitations of massive information processing as well as system complexity and enlargement, weight, power consumption, and the like are increased. Thus, the current highly integrated method is not very suitable for electronics that are automatically and constantly driven and human-friendly.

Therefore, in order to overcome the limitations of scaling technology through the current miniaturization and high-integration method, future information communication technology (ICT) requires a new direction for multifunctionalization (functionality & diversification) that is capable of simultaneously performing functions of detecting and displaying human sensory information. However, current technology reaches only a level of simple stacking or compositing of an independent sensing element and display element or an independent sensing element and display material and thus does not beyond the limitations of integration technology. Accordingly, ultra-low power driving for constant driving is not easy.

Some artificial synesthesia elements, which use a speaker or microphone and display fusion technology or sensor and display fusion technology in order to detect and display human sensory information, have been reported in academia, but the artificial synesthesia element is an element in which separate elements are connected through a microprocessor or two or more elements are formed in the form of a stack. Recently, research is being conducted to prepare materials, which each play a certain role, in a composite form, but ultimately, in order to overcome the limitations of ultra-low power and ultra-thin films of wearable devices, it is ideal that one element or one material performs multiple sensing, switching, and displaying.

Accordingly, in order to implement an ultra-low power artificial synesthesia element that can be constantly driven, it is first necessary to develop an ultra-lightweight material for ultra-low power driving above all else, and the most ideal method is a method of combining mechanical and optical elements at a molecular level within a single material. In terms of materials, a mechanical function of artificial synesthesia can be implemented using a dielectric piezoelectric material, and an optical function thereof can be implemented using a semiconductor light-emitting material. In particular, in the case of the piezoelectric material, a self-generating property thereof capable of generating electricity by external stress enables the implementation of an artificial synesthesia element for constant powerless driving. As described above, an artificial synesthesia electronic material that simultaneously implements functions of piezoelectric and light-emitting materials is defined as a synchronized piezoelectric and luminescence (SPL) material, and there is a need to develop a single SPL material.

Meanwhile, there have been proposed research in manufacturing a composite film of perovskite nanocrystal ($MAPbX_3$)/piezoelectric polymer (polyvinylidene fluoride (PVDF)) through an in-situ method [Adv. Mater. 2016, 28, 9163-9168] and research in manufacturing a composite film of inorganic quantum dots ($Cd_xZn_{1-x}Se_yS_{1-y}$)/piezoelectric polymer (PVDF) through a blade-coating method [ACS Appl. Mater. Interfaces 2018, 10, 15880-15887].

However, in the preceding research, since materials are physically mixed through a simple fusion method of two or more single functional materials, there is a limitation in implementing ultra-flexible and ultra-low power functions.

SUMMARY

The present invention is directed to providing a single synchronized piezoelectric and luminescence (SPL) material simultaneously having a piezoelectric property and a luminescent property by attaching piezoelectric ligands to light-emitting particles to impart a piezoelectric property to the light-emitting particles, and an element including the same.

According to an aspect of the present invention, there is provided a synchronized piezoelectric and luminescence material including a core layer including light-emitting particles and a shell layer which is attached onto a surface of the core layer and includes ligands having a piezoelectric property.

According to one embodiment, the light-emitting particles may be surrounded by the plurality of ligands, and some or all of the ligands may be ligands having the piezoelectric property.

According to another embodiment, the ligand having the piezoelectric property may be attached onto the surface of the core layer through a ligand exchange.

The ligand having the piezoelectric property may be represented by Formula 1 below:

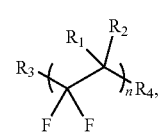

[Formula 1]

wherein, in Formula 1, each of $R_1$ and $R_2$ is independently hydrogen (H), iron (F), chlorine (Cl), COOH, COOR, or $CF_3$, each of $R_3$ and $R_4$ is independently H, OH, SH, SSOR, $NH_2$, $N_3$, COOH, Cl, bromine (Br), iodine (I), or an alkynyl group having 1 to 10 carbon atoms, each R is independently a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms, and n is an integer from 1 to 50,000.

The light-emitting particles may be at least one selected from the group consisting of perovskite crystals, silicon (Si)-based crystals, Group II-VI-based compound semiconductor crystals, Group III-V-based compound semiconductor crystals, Group IV-VI-based compound semiconductor crystals, boron quantum dots, carbon quantum dots, and metal quantum dots.

The perovskite crystals may have a structure of $ABX_3$ (3D), $A_4BX_6$(0D), $AB_2X_5$(2D), $A_2BX_4$(2D), $A_2BX_6$(0D), $A_2B^+B^{3+}X_6$(3D), $A_3B_2X_9$(2D), or $A_{n-1}B_nX3_{n+1}$ (quasi-2D), wherein n is an integer of two to six, A refers to a monovalent cation, B refers to a metal material, and X refers to a halogen element.

A may be at least one selected from the group consisting of $(C_xH_{2x+1}NH_3)_n^+$, $(C_6H_5C_xH_{2x+1}NH_3)_n^+$, $(CH(NH_2)_2)_n^+$, $(NH_4)_n^+$, $(NF_4)_n^+$, $(NCl_4)_n^+$, $(PH_4)_n^+$, $(PF_4)_n^+$, $(PCl_4)_n^+$, $(C(NH_2)_3)_n^+$, $((C_xH_{2x+1})_nNH_3)_2(CHNH_3)_n^+$, $(CF_3NH_3)_n^+$, $(C_xF_{2x+1})_nNH_3)_2(CFNH_3)_n^+$, $((C^xF_{2x+1})_nNH_3)_2^+$, $(CH_3PH_3)_n^+$, $(CH_3AsH_3)_n^+$, $(CH_3SbH_3)_n^+$, $(AsH_4)_n^+$, $(SbH_4)_n^+$, $Cs^+$, $Rb^+$, and $K^+$, wherein n is an integer of one or more, and x is an integer of one or more, B may be at least one selected from the group consisting of a divalent transition metal, a rare earth metal, an alkaline earth metal, lead (Pb), tin (Sn), germanium (Ge), gallium (Ga), indium (In), aluminum (Al), antimony (Sb), bismuth (Bi), and polonium (Po), and X may be at least one selected from the group consisting of chlorine (Cl), bromine (Br), and iodine (I).

The Group II-VI-based compound semiconductor crystals may be at least one selected from the group consisting of CdS, CdSe, CdTe, ZnS, ZnSe, ZnTe, HgS, HgSe, HgTe, CdSeS, CdSeTe, CdTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe.

The Group III-V-based compound semiconductor crystals may be at least one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

The Group IV-VI-based compound semiconductor crystals may be at least one selected from the group consisting of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, and SnPbSTe.

The carbon quantum dots may be at least one selected from the group consisting of graphene quantum dots, carbon quantum dots, $C_3N_4$ syndiotactic quantum dots, and polymer quantum dots.

The metal quantum dots may be at least one selected from the group consisting of gold (Au), silver (Ag), aluminum (Al), copper (Cu), lithium (Li), palladium (Pd), and platinum (Pt).

The synchronized piezoelectric and luminescence material may have an emission wavelength of 200 nm to 1,500 nm and a polarization of 0.1 $\mu C/cm^2$ to 100 $\mu C/cm^2$.

According to another aspect of the present invention, there is provided a method of preparing a synchronized piezoelectric and luminescence material including mixing a solution (a) including light-emitting particles or precursors thereof and a solution (b) including ligands having a piezoelectric property in a polar solvent, and optionally, mixing a solution (c) including ligands having a piezoelectric property in an antisolvent together with the solution (a) and the solution (b), if necessary.

According to one embodiment, the method may include mixing the solution (a) and the solution (b), and adding the solution (c) to the resultant mixture.

According to another embodiment, the method may include mixing the solution (a) and the solution (c) and adding the solution (b) to the resultant mixture to be mixed with each other.

According to still another embodiment of the present invention, hydrophilic monomolecular ligands such as mono-2-(methacryloyloxy)ethyl succinate (MMES) may be additionally attached to the light-emitting particles or the precursors thereof in the solution (a).

According to yet another embodiment of the present invention, the ligand in the solution (b) may derive from a fluoride resin such as polyvinylidene fluoride (PVDF) and may have a structure substituted with H, OH, SH, SSOR, or COOH, wherein R is a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms.

According to still another aspect of the present invention, there is provided a synchronized piezoelectric and luminescence material prepared according to the method.

According to yet another aspect of the present invention, there is provided a synchronized piezoelectric and luminescence element including a substrate, a first electrode disposed on the substrate, a light-emitting layer disposed on the first electrode, and a second electrode disposed on the light-emitting layer, wherein the light-emitting layer includes the synchronized piezoelectric and luminescence material.

DETAILED DESCRIPTION

Figure 1:
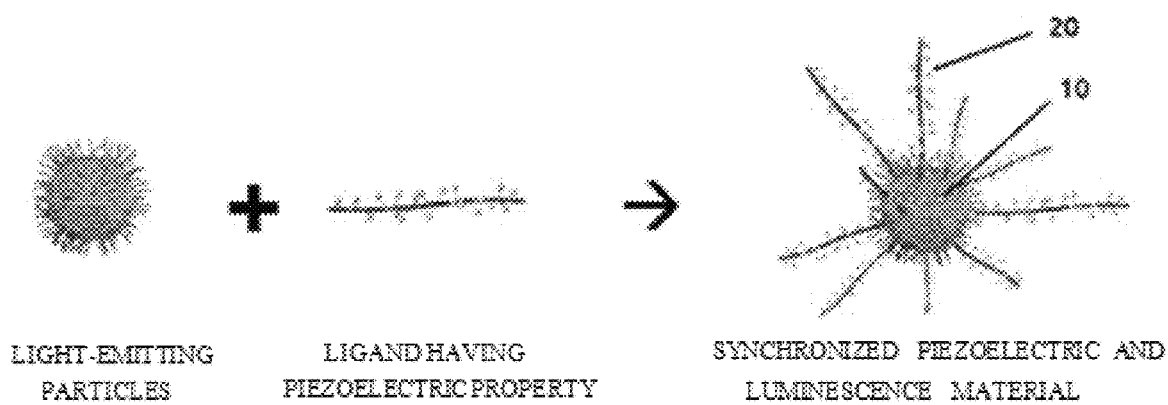
FIG. 1 is a schematic diagram illustrating a synchronized piezoelectric and luminescence material according to one embodiment of the present invention.

While the present invention is open to various modifications and alternative embodiments, specific exemplary embodiments thereof will be described and illustrated by way of example in the accompanying drawings. However, it is to be understood that the present invention is not limited to a specific disclosed form but includes all modifications, equivalents, and substitutions without departing from the scope and sprit of the present invention.

It will be further understood that the terms "comprise," "comprising," "include," and/or "including," when used herein, specify the presence of stated features, numbers, steps, operations, elements, components, or combinations thereof but do not preclude the presence or addition of one or more other features, numbers, steps, operations, elements, components, and/or combinations thereof.

In the present specification, the expression "synchronized piezoelectric and luminescence (SPL)" may mean having both a piezoelectric property and a luminescent property.

In the present specification, the term "single SPL material" refers to an artificial synesthesia electronic material in which a piezoelectric property and a luminescent property are simultaneously implemented using a single material.

Such a single SPL material may be implemented through various methods, and SPL properties may be implemented in the form of particles including a core, which is a light-emitting part, and a ligand positioned on a surface of the core.

Accordingly, an SPL material according to the present invention includes a core layer which includes light-emitting particles and a shell layer which is attached onto a surface of the core layer and includes ligands having a piezoelectric property.

Here, the light-emitting particles may be at least one selected from the group consisting of perovskite crystals, silicon (Si)-based crystals, Group II-VI-based compound semiconductor crystals, Group III-V-based compound semiconductor crystals, Group IV-VI-based compound semiconductor crystals, boron quantum dots, carbon quantum dots, and metal quantum dots. Specifically, the light-emitting particles may be perovskite crystals or metal quantum dots.

The perovskite crystals may have a structure of $ABX_3$ (3D), $A_4BX_6$(0D), $AB_2X_5$(2D), $A_2BX_4$(2D), $A_2BX_6$(0D), $A_2B^+B^{3+}X_6$(3D), $A_3B_2X_9$(2D), or $A_{n-1}B_nX3_{n+1}$ (quasi-2D), wherein n is an integer of two to six, A refers to a monovalent cation, B refers to a metal material, and X refers to a halogen element.

In this case, A may be at least one selected from the group consisting of $(C_xH_{2x+1}NH_3)_n^+$, $(C_6H_5C_xH_{2x+1}NH_3)_n^+$, $(CH(NH_2)_2)_n^+$, $(NH_4)_n^+$, $(NF_4)_n^+$, $(NCl_4)_n^+$, $(PH_4)_n^+$, $(PF_4)_n^+$, $(PCl_4)_n^+$, $(C(NH_2)_3)_n^+$, $((C_xH_{2x-1})_nNH_3)_2(CHNH_3)_n^+$, $(CF_3NH_3)_n^+$, $(C_xF_{2x+1})_nNH_3)_2(CFNH_3)_n^+$, $((C^+F_{2x+1})_nNH_3)_2^+$, $(CH_3PH_3)_n^+$, $(CH_3AsH_3)_n^+$, $(CH_3SbH_3)_n^+$, $(AsH_4)_n^+$, $(SbH_4)_n^+$, $Cs^+$, $Rb^+$, and $K^+$, wherein n is an integer of one or more, and x is an integer of one or more. B may be at least one selected from the group consisting of a divalent transition metal, a rare earth metal, an alkaline earth metal, lead (Pb), tin (Sn), germanium (Ge), gallium (Ga), indium (In), aluminum (Al), antimony (Sb), bismuth (Bi), and polonium (Po). X may be at least one selected from the group consisting of chlorine (Cl), bromine (Br), and iodine (I).

The Group II-VI-based compound semiconductor crystals may be at least one selected from the group consisting of CdS, CdSe, CdTe, ZnS, ZnSe, ZnTe, HgS, HgSe, HgTe, CdSeS, CdSeTe, CdTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe.

The Group III-V-based compound semiconductor crystals may be at least one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

The Group IV-VI-based compound semiconductor crystals may be at least one selected from the group consisting of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, and SnPbSTe.

The carbon quantum dots may be at least one selected from the group consisting of graphene quantum dots, carbon quantum dots, $C_3N_4$ syndiotactic quantum dots, and polymer quantum dots.

The metal quantum dots may be at least one selected from the group consisting of gold (Au), silver (Ag), aluminum (Al), copper (Cu), lithium (Li), palladium (Pd), and platinum (Pt).

Meanwhile, representative high luminous efficiency particles include Group II-VI- or III-V-based semiconductor crystals and perovskite particles. The Group II-VI- or III-V-based semiconductor crystals may adjust a color by adjusting a particle size using a quantum confinement effect, may implement high color purity (full width at half maximum (FWHM)≈30 nm) as compared with an organic luminous material, and may have a particle size of several nanometers. Since metal halide perovskite particles have high color purity (FWHM<25 nm) due to a crystal structure thereof irrespective of a particle size, color adjustment thereof is simple, and synthesis costs thereof are low, the metal halide perovskite particles are very likely to be developed as luminous materials.

However, nanoparticles used as luminous materials may have a large surface-to-volume ratio due to a small particle size of several nanometers to several tens of nanometers and thus may have a high defect concentration. Therefore, there is an essential need to develop technology capable of simultaneously effectively controlling defects that may be formed in surfaces of nanocrystals as well as inside of nanoparticles.

Particles are distinguished from grains. Most of the particles are colloidal particles of which one particle acts independently and which are synthesized and obtained in a solution state. Even in this case, ligands surrounding the particles are present due to chemical action in most cases. Grains surround particles in a polycrystalline thin film, form a grain boundary without a ligand, are connected to each other, and are mainly formed into a polycrystalline thin film by reacting directly from a precursor. Here, one grain may look just like a particle, but in this case, the particle being regarded as a grain is accurate, and since one grain cannot be separately defined, the grain is not regarded as a particle. In the case of particles, when a ligand is not present, the particles are all deposited within several hours and thus may not be stably dispersed. As a ligand, small molecules, which serve as surfactants, are mainly used. In this case, the ligand may prevent the physical contact between particles and passivate the surface defects to improve the stability and luminescent property of the particles and may impart the specific properties to the particles by adjusting a dispersion solvent or the like according to the properties of the ligand.

Meanwhile, the present invention is characterized by providing a material simultaneously having a piezoelectric property and a luminescent property by attaching ligands to light-emitting particles to impart a piezoelectric property to the particles, and an element including the same.

That is, the light-emitting particles according to the present invention may be surrounded by the plurality of ligands, and some or all of the ligands may be ligands having a piezoelectric property.

In this case, the ligand having a piezoelectric property may be represented by Formula 1 below.

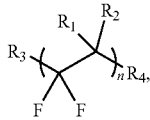

[Formula 1]

In Formula 1, $R_1$ and $R_2$ may each independently be hydrogen (H), iron (F), chlorine (Cl), COOH, COOR, or $CF_3$, more specifically may be H, F, or Cl, and still more specifically may be H or F.

$R_3$ and $R_4$ may each independently be H, OH, SH, SSOR, $NH_2$, $N_3$, COOH, Cl, bromine (Br), iodine (I), or an alkynyl group having 1 to 10 carbon atoms, and more specifically, may be H, OH, SH, SSOR, or COOH.

Each R may independently be a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms, and more specifically, may be a hydrogen atom or a substituted or unsubstituted alkyl group having 1 to 10 carbon atoms. Here, the alkyl group and the aryl group may be substituted with a halogen atom.

n may be an integer from 1 to 50,000.

According to one embodiment of the present invention, in Formula 1, $R_1$ and $R_2$ may each independently be H, F, or Cl, $R_3$ and $R_4$ may each independently be H, OH, SH, SSOR, or COOH, and R may be a hydrogen atom or a substituted or unsubstituted alkyl group having 1 to carbon atoms.

In this case, the ligand having a piezoelectric property represented by Formula 1 may be any one selected from among compounds shown in compound group 1 below. However, embodiments are not limited thereto.

[Compound Group 1]

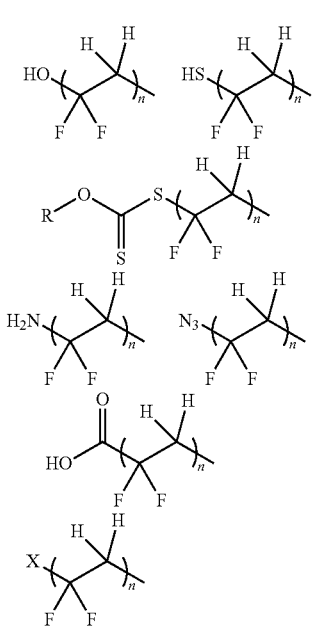

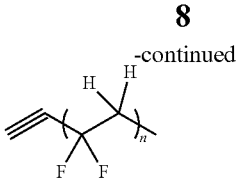

In compound group 1, each R is independently a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms, X is F, Cl, Br, or I, and n is an integer of 1 to 50,000.

Meanwhile, the ligand having a piezoelectric property may be any one selected from among compounds shown in compound group 2 below. However, embodiments are not limited thereto.

[Compound Group 2]

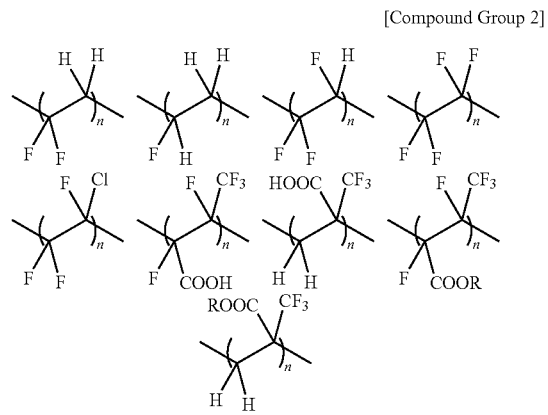

In compound group 2, each R may independently be a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms, and n may be an integer from 1 to 50,000.

The ligand having a piezoelectric property represented by Formula 1 may derive specifically from a fluoride resin such as polyvinylidene fluoride (PVDF) and may have a structure substituted with H, OH, SH, SSOR, or COOH.

The "substituted or unsubstituted alkyl group having 1 to 10 carbon atoms" may be a branched or linear alkyl group, may be substituted with a halogen atom, COOH, or $CF_3$, and specifically may be unsubstituted.

The "substituted or unsubstituted aryl group having 6 to 30 ring carbon atoms" may be substituted with a halogen atom, COOH, or $CF_3$ and specifically may be unsubstituted.

Specifically, each R may be independently a hydrogen atom, a halogen atom, or substituted or unsubstituted alkyl group having 1 to 10 carbon atoms.

As described above, the material according to the present invention includes the shell layer formed by attaching the ligands having a piezoelectric property to the surface of the core layer including the luminous particles, thereby simultaneously implementing a piezoelectric property and a luminescent property. Specifically, the SPL material according to the present invention has a wide emission wavelength of 200 nm to 1,500 nm and a polarization of 0.1 $\mu C/cm^2$ to 100 $\mu C/cm^2$.

Therefore, since the SPL material according to the present invention has a piezoelectric property and a luminescent property at the same time, the SPL material can be applied to efficient communication by visualizing various input signals, such as sound, touch, and temperature signals, thereby being usefully used for a next-generation future-oriented wearable synesthesia element.

The synesthesia element includes various elements used in all fields such as industrial, commercial, medical, vehicle, and personnel computer (PC) fields. As an example of the synesthesia element, there may be a stretchable device. Since an existing photoelectric element is manufactured on a stretchable substrate, the stretchable device can be operated even when the substrate is contracted or stretched, and thus, various application fields thereof may be created. In addition, the stretchable device may be variously used as a core component material for implementing wearable electronic devices, electronic skins, Internet of Things (IoT) devices, electronic devices for a vehicle, and artificially intelligent (AI) robots.

As an example, the SPL material according to the present invention may be applied to a light-emitting layer of a light-emitting element. Such a light-emitting element includes a substrate, a first electrode disposed on the substrate, a light-emitting layer disposed on the first electrode, and a second electrode disposed on the light-emitting layer, and the light-emitting layer includes the SPL material according to the present invention.

The substrate may be a flexible substrate, and the flexible substrate may be, for example, a polyimide substrate or a polyethylene naphthalate (PEN) substrate.

The first electrode layer and the second electrode layer may include at least one selected from the group consisting of gold, silver, copper, graphene, silicon nanowires, carbon nanotubes, and indium tin oxide.

According to one embodiment of the present invention, the light-emitting element of the present invention may further include one or more additional layers such as a hole injection layer, a hole transport layer, a conductive layer, a nonconductive layer, an electron transport layer, an electron injection layer, and a capping layer.

According to another embodiment of the present invention, the light-emitting element may be used in a wearable electronic device, an electronic skin, or an electronic device for a vehicle.

Hereinafter, the present invention will be described in detail through Examples, but the following Examples and Experimental Examples only exemplify one form of the present invention, and the scope of the present invention is not limited by the following Examples and Experimental Examples.

[Example 1] Preparation of Ligand-Attached Perovskite Nanoparticle Solution and Manufacturing of Film A precursor solution (solution 1) was prepared by dissolving a metal halide perovskite in a polar solvent. In this case, dimethylformamide was used as the polar solvent, and formamidinium bromide (FABr) and $PbBr_2$ were used as a metal halide perovskite precursor. In this case, FABr and $PbBr_2$ were used in a ratio of 2:1. Thereafter, a polar solution (solution 2) including a piezoelectric ligand was prepared. In this case, dimethylformamide (DMF) was used as the polar solvent, and PVDF-COOH was used as the piezoelectric ligand. In this case, a concentration of the PVDF-COOH ligand in the solution was set to 10 wt %. Thereafter, an anti-solvent solution (solution 3) including a ligand was prepared. As a solvent for the anti-solvent solution, a solvent in which toluene and 1-butanol were mixed was used, and a mixing ratio of the mixed solvent was 5:2. As the ligand, an oleic acid and octyl amine were used. Thereafter, solution 1 and solution 2 were mixed and then dropped into solution 3 to induce crystallization of metal halide perovskite nanoparticles. As the precursor solution of the metal halide perovskite was mixed with the anti-solvent solution, solubility thereof was rapidly decreased, and as a result, a metal halide perovskite crystal surrounded by a ligand including a piezoelectric ligand was precipitated.

After such a prepared metal halide perovskite nanoparticle solution is applied on a glass substrate, spin coating was performed on the glass substrate rotating at a speed of 500 rpm, thereby manufacturing a perovskite film.

[Example 2] Method of Preparing Particles Through Ligand Exchange and Manufacturing of Film A precursor solution (solution 1) was prepared by dissolving a metal halide perovskite in a polar solvent. In this case, DMF was used as the polar solvent, and FABr and $PbBr_2$ were used as a metal halide perovskite precursor. In this case, FABr and $PbBr_2$ were used in a ratio of 2:1. Thereafter, a polar solution (solution 2) including a piezoelectric ligand was prepared. In this case, DMF was used as the polar solvent, and PVDF-COOH was used as the piezoelectric ligand. In this case, a concentration of the PVDF-COOH ligand in the solution was set to 10 wt %. Thereafter, an anti-solvent solution (solution 3) including a ligand was prepared. As a solvent for the anti-solvent solution, a solvent in which toluene and 1-butanol were mixed was used, and a mixing ratio of the mixed solvent was 5:2. As the ligand, an oleic acid and octyl amine were used. Thereafter, solution 1 was dropped into solution 3 to induce crystallization of metal halide perovskite nanoparticles. As the precursor solution of the metal halide perovskite was mixed with the anti-solvent solution, solubility thereof was rapidly decreased, and as a result, a metal halide perovskite crystal surrounded by a ligand was precipitated. Thereafter, solution 2 was injected into a solution including the precipitated perovskite crystal to induce a ligand exchange to attach a piezoelectric ligand onto a surface of the perovskite crystal. In this case, an injected amount of solution 2 was 50 µl.

After such a prepared metal halide perovskite nanoparticle solution is applied on a glass substrate, spin coating was performed on the glass substrate while the glass substrate was rotating at a speed of 500 rpm, thereby manufacturing a perovskite film.

[Example 3] Preparation of Piezoelectric Ligand-Attached Quantum Dot Solution and Manufacturing of Film A polar solution (solution 1) including a hydrophilic monomolecular ligand was prepared. In this case, propylene glycol methyl ether acetate (PGMEA) was used as a polar solvent, and mono-2-(methacryloyloxy)ethyl succinate (MMES) was used as the hydrophilic monomolecular ligand. In this case, a concentration of the MMES ligand in the solution was set to 5 mg/mL. Thereafter, a nonpolar solution (solution 2) including inorganic quantum dots was prepared. In this case, hexane was used as a nonpolar solvent, and inorganic quantum dots attached with an oleic acid were used. In this case, a concentration of the inorganic quantum dots in the solution was set to 5 mg/ml. Thereafter, solution 2 was mixed with solution 1 to form a mixed solution (solution 3). Solution 3 was stirred for 10 minutes to attach the MMES to the inorganic quantum dots. Then, the inorganic quantum dots were precipitated in a cold hexane solvent. Thereafter, a polar solution (solution 4) including a piezoelectric ligand was prepared. In this case, DMF was used as a polar solvent, and PVDF-SH was used as the piezoelectric ligand. Here, a concentration of the PVDF-SH ligand in the solution was set to 20 mg/mL. Thereafter, the solution was stirred for 12 hours or more to attach the PVDF-SH ligand to the inorganic quantum dots. Then, the inorganic quantum dots were precipitated in a cold hexane solvent and dispersed again in DMF. As a result, inorganic quantum dots (PVDF-QDs) surrounded by ligands including piezoelectric ligands were prepared.

After such an inorganic quantum dot solution is applied on a glass substrate, spin coating was performed on the glass substrate rotating at a speed of 500 rpm, thereby manufacturing an inorganic quantum dot film.

[Example 4] Manufacturing of Perovskite Element

First, after an indium tin oxide (ITO) substrate (glass substrate coated with an ITO positive electrode) was provided, spin coating was performed on the ITO positive electrode with a conductive material PEDOT:PSS (AI4083 manufactured by Heraeus Company), and then heat treatment was performed thereon at a temperature 150° C. for 30 minutes to form an hole injection layer having a thickness of 50 nm.

Next, the perovskite nanoparticle solution attached with a piezoelectric ligand prepared in Example 1 was applied on the hole injection layer, and spin coating was performed on the hole injection layer rotating at a speed of 500 rpm, thereby forming a light-emitting layer having a thickness of 50 nm.

Thereafter, 1,3,5-tris(1-phenyl-1H-benzimidazol-2-yl)benzene (TPBI) was deposited to a thickness of 50 nm on the perovskite light-emitting layer at a high vacuum of $1 \times 10^{-7}$ Torr or less to form an electron transport layer, LiF was deposited to a thickness of 1 nm on the electron transport layer to form an electron injection layer, and aluminum was deposited to a thickness of 100 nm on the electron injection layer to form a negative electrode, thereby manufacturing a perovskite light-emitting diode.

[Example 5] Manufacturing of Perovskite Inverted Element

First, after an ITO substrate (glass substrate coated with an ITO negative electrode) was provided, spin coating was performed on the ITO negative electrode with a semiconductor material ZnO, and heat treatment was performed thereon at a temperature 150° C. for 1 hour to form an electron injection layer having a thickness of 60 nm.

Next, spin coating was performed on the electron injection layer with polyvinylpyrrolidone (PVP), and then heat treatment was performed thereon at a temperature of 100° C. for 10 minutes to form a non-conductor layer having a thickness of 10 nm.

Then, the perovskite nanoparticle solution attached with a piezoelectric ligand prepared in Example 2 was applied on the electron injection layer, and spin coating was performed on the electron injection layer rotating at a speed of 500 rpm to form a perovskite light-emitting layer.

Thereafter, tris(4-carbazoyl-9-ylphenyl)amine (TCTA) was deposited to a thickness of 50 nm on the perovskite light-emitting layer at a high vacuum of $1 \times 10^{-7}$ Torr or less to form a hole transport layer, and $MoO_3$ was deposited to a thickness of 5 nm on the hole transport layer to form a hole injection layer.

Silver was deposited to a thickness of 100 nm on the hole injection layer to form a positive electrode, thereby manufacturing a perovskite light-emitting diode.

[Example 6] Manufacturing of PVDF-QD Element

First, after an ITO substrate (glass substrate coated with an ITO negative electrode) was provided, a cleaning process was performed using each of acetone and isopropyl alcohol (IPA) solutions to prepare manufacturing of a diode. In order to form a thin film of electron transport layer material ZnO on the ITO negative electrode, zinc acetate dihydrate was dissolved in an ethanol solvent, spin coating was performed, and heat treatment was performed at a temperature of 140° C. to form an electron transport layer having a thickness of several tens of nanometers. Next, in order to adjust band gap energy between the ZnO thin film and an organic light-emitting layer in which a polymer material (PDVF) and quantum dots ($CdSe^-Zn_{1-x}Cd_xS$) are synthesized, a polyethylenimine (PEI) solution was applied on the electron transport layer, and spin coating was performed on the electron transport layer rotating at a speed of 5,000 rpm. A manufactured thin film was heat-treated at a temperature of 100° C. for 10 minutes to form a thin film having a thickness of several nanometers.

Thereafter, an organic light-emitting material, i.e., the PVDF-QDs synthesized in Example 3, was dissolved in a DMF solution and applied on a thin film layer of such an element, and spin coating was performed on the thin film layer rotating at a speed of 1,000 rpm to form a thin film layer of several nanometers. Then, $WO_3$ was deposited to a thickness of 15 nm on an organic light-emitting layer at a high vacuum of $1 \times 10^{-7}$ Torr or less to form a hole transport layer, and Al was deposited to a thickness of 70 nm on the hole transport layer to form a positive electrode, thereby manufacturing a light-emitting diode.

[Comparative Example 1] Manufacturing of Perovskite Nanoparticle Film

After a metal halide perovskite nanoparticle solution is applied on a glass substrate, spin coating was performed on the glass substrate rotating at a speed of 500 rpm, thereby manufacturing a perovskite film.

Experimental Example

In order to evaluate the luminescent property, ferroelectricity, and piezoelectric property of the materials according to Examples, the following experiment was performed.

Figure 2:
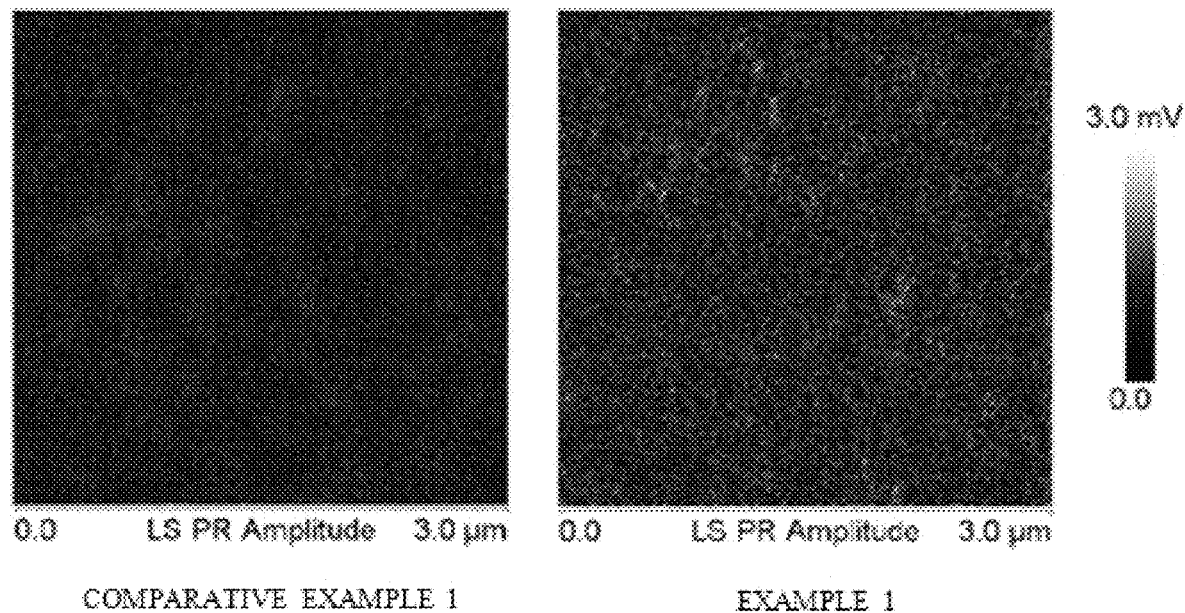
FIG. 2 shows results obtained by piezoelectric force microscopy measurement on a perovskite nanoparticle material attached with a piezoelectric ligand according to Example 1 of the present invention.

First, piezoelectric force microscopy measurement was performed on a perovskite nanoparticle material attached with a piezoelectric ligand according to Example 1, and the results were shown in FIG. 2. As can be seen from FIG. 2, it can be seen that the perovskite nanoparticle material attached with a piezoelectric ligand according to Example 1 has a piezoelectric property.

Figure 3:
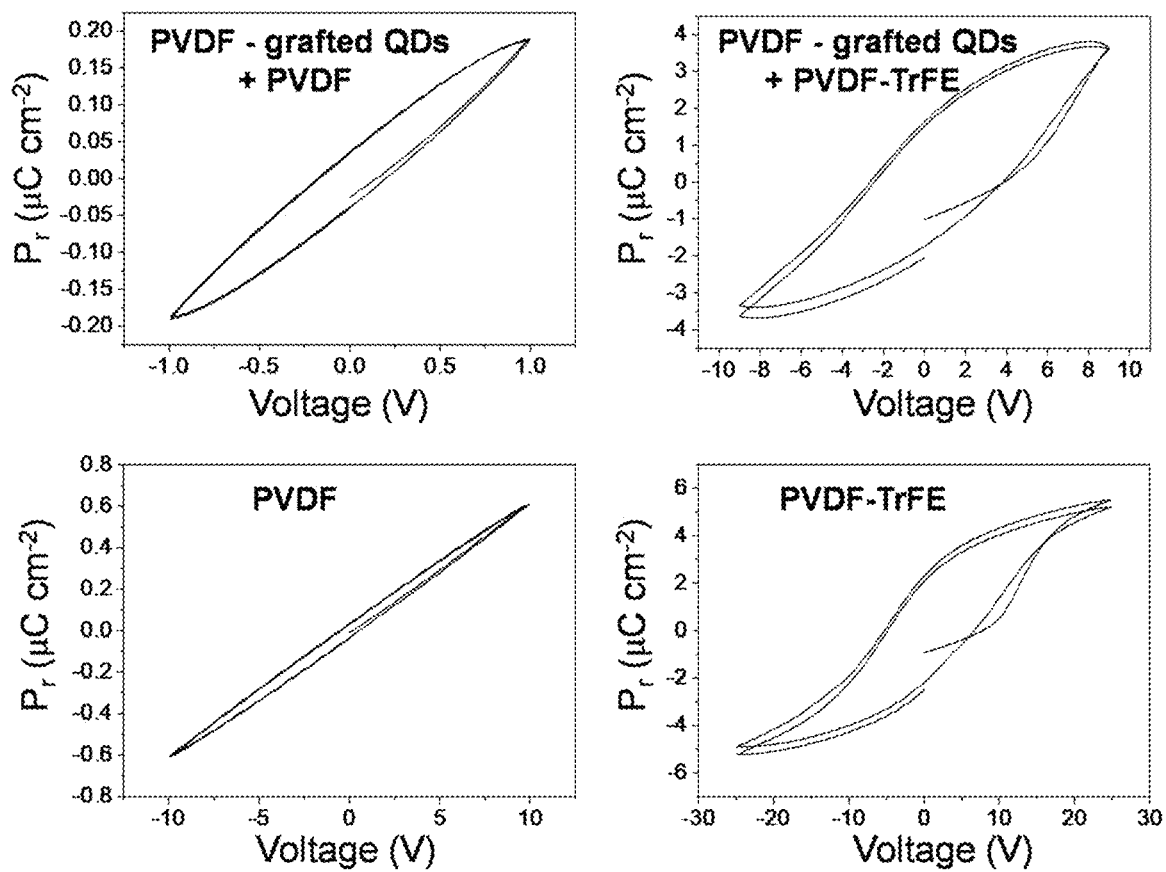
FIG. 3 shows a polarization history curve of an inorganic quantum dot material attached with a piezoelectric ligand according to Example 3 of the present invention.
Figure 4:
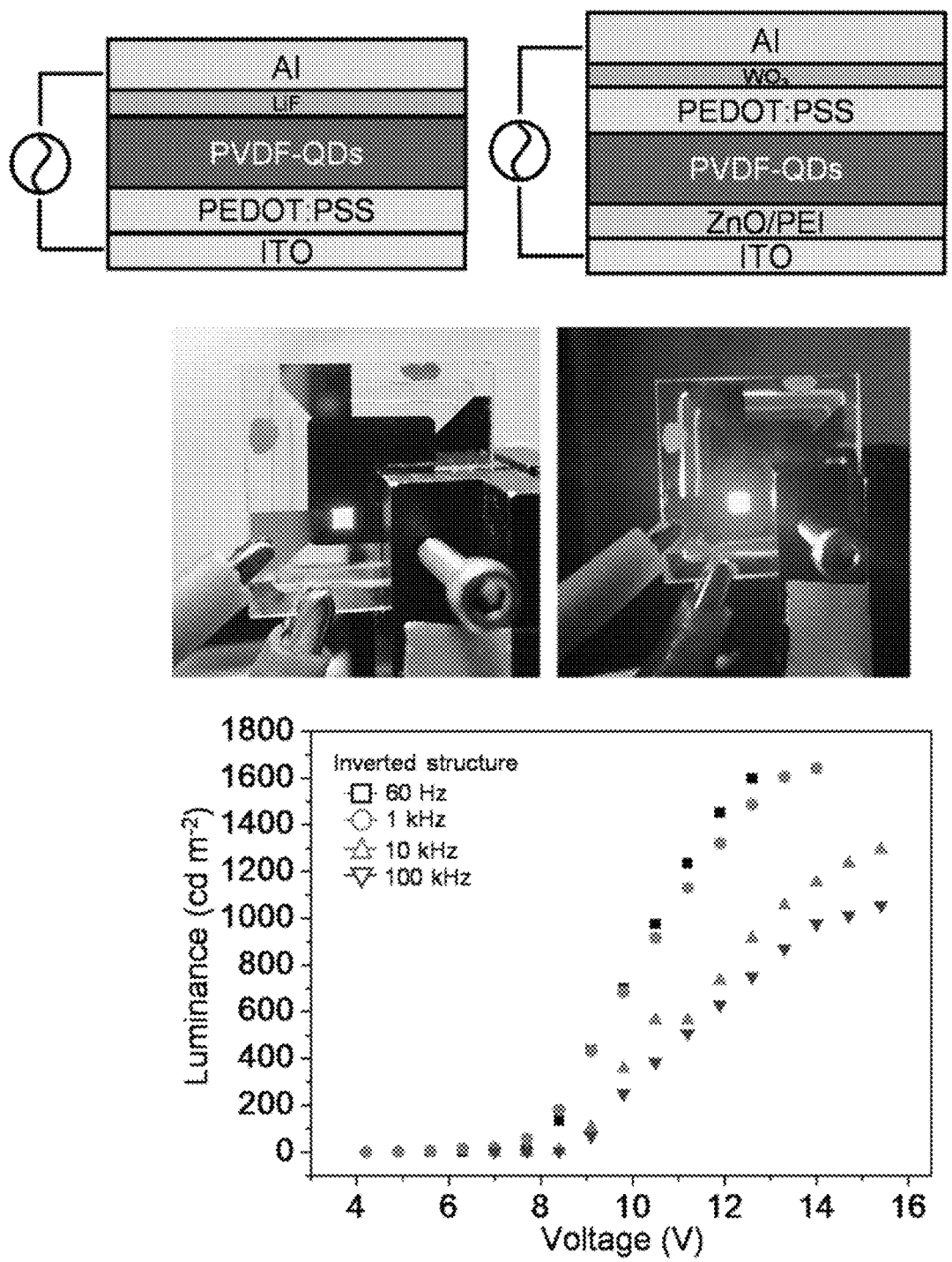
FIG. 4 shows results obtained by driving an element to which an inorganic quantum dot material attached with a piezoelectric ligand according to Example 6 of the present invention is applied.

In addition, a polarization history curve of an inorganic quantum dot material attached with a piezoelectric ligand according to Example 3 was derived, and the results were shown in FIG. 3. Referring to FIG. 3, it can be seen that the inorganic quantum dot material attached with a piezoelectric ligand according to Example 3 has an excellent piezoelectric property.

In addition, the driving result of an element (Example 6) to which the inorganic quantum dot material attached with a piezoelectric ligand according to Example 3 is applied is shown in FIG. 6, and it can be seen that the material also has a high luminescent property.

As a result, it can be seen that an electronic element including the SPL material according to the present invention has the excellent luminescent property, ferroelectricity, and piezoelectric property. From the results, the SPL material according to the present invention may exhibit the excellent luminescent property, ferroelectricity, and piezoelectric property, and it can be seen that an electronic element including the same can be usefully used for an organic light-emitting element, a transistor, a capacitor, and the like.

A material according to the present invention is a single SPL material in which piezoelectric ligands and light-emitting particles are chemically coupled, thereby simultaneously implementing a piezoelectric property and a luminescent property. In addition, an element based on the material can be manufactured, and an element system simultaneously having a piezoelectric property and a luminescent property can be designed through the element.

Accordingly, an element including the material can perform efficient communication by visualizing various input signals, thereby being usefully used in a future-oriented synesthesia technology field. In addition, since the element including the material is an all-in-one element, additional components and processes are not required, and thus, the element has high economic competitiveness, thereby contributing greatly to the commercialization of synesthesia elements.

While the present invention has been described with reference to the exemplary embodiments thereof, it will be appreciated by those skilled in the corresponding art or those having ordinary knowledge in the corresponding art that the present invention may be modified and altered in various manners without departing from the spirit and technical scope of the present invention that are set forth in the following claims.

Therefore, the technical scope of the present invention should not be limited to the contents described in the detailed description of the specification but should be defined by the claims.

What is claimed is:

1. A method of preparing a synchronized piezoelectric and luminescence material, the method comprising:
   mixing a solution (a) including light-emitting particles or precursors thereof and a solution (b) including ligands having a piezoelectric property in a polar solvent; and
   optionally, mixing a solution (c) including ligands having a piezoelectric property in an antisolvent together with the solution (a) and the solution (b), if necessary,
   wherein the synchronized piezoelectric and luminescence material has an emission wavelength of 200 nm to 1,500 nm and a polarization of 0.1 $\mu C/cm^2$ to 100 $\mu C/cm^2$.

2. The method of claim 1, wherein the method includes:
   mixing the solution (a) and the solution (b); and
   adding the solution (c) into the resultant mixture to be mixed with each other.

3. The method of claim 1, wherein the method includes:
   mixing the solution (a) and the solution (c); and
   adding the solution (b) into the resultant mixture to be mixed with each other.

4. The method of claim 1, wherein the ligand in the solution (b) derives from a fluoride resin and has a structure substituted with H, OH, SH, SSOR, or COOH,
   wherein R is a hydrogen atom, a deuterium atom, a halogen atom, a cyano group, a substituted or unsubstituted alkyl group having 1 to 10 carbon atoms, or a substituted or unsubstituted aryl group having 6 to 30 ring carbon atoms.

\* \* \* \* \*